(12) United States Patent
Gardner et al.

(10) Patent No.: US 11,631,737 B2
(45) Date of Patent: Apr. 18, 2023

(54) INGAAS EPI STRUCTURE AND WET ETCH PROCESS FOR ENABLING III-V GAA IN ART TRENCH

(71) Applicant: Intel Corporation, Santa Clara, CA (US)

(72) Inventors: Sanaz K. Gardner, Portland, OR (US); Willy Rachmady, Beaverton, OR (US); Matthew V. Metz, Portland, OR (US); Gilbert Dewey, Hillsboro, OR (US); Jack T. Kavalieros, Portland, OR (US); Chandra S. Mohapatra, Beaverton, OR (US); Anand S. Murthy, Portland, OR (US); Nadia M. Rahhal-Orabi, Hillsboro, OR (US); Nancy M. Zelick, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/529,481

(22) PCT Filed: Dec. 24, 2014

(86) PCT No.: PCT/US2014/072396
§ 371 (c)(1),
(2) Date: May 24, 2017

(87) PCT Pub. No.: WO2016/105426
PCT Pub. Date: Jun. 30, 2016

(65) Prior Publication Data
US 2017/0263706 A1    Sep. 14, 2017

(51) Int. Cl.
*H01L 29/205*    (2006.01)
*H01L 29/06*    (2006.01)
(Continued)

(52) U.S. Cl.
CPC .... *H01L 29/0673* (2013.01); *H01L 21/76224* (2013.01); *H01L 29/045* (2013.01);
(Continued)

(58) Field of Classification Search
CPC ............... H01L 29/045; H01L 29/0649; H01L 29/0673; H01L 29/205; H01L 29/267;
(Continued)

(56) References Cited

U.S. PATENT DOCUMENTS

| 20,140,225 | 8/2014 | Rachmady |
| 9,876,088 B1 * | 1/2018 | Van Dal ................. H01L 29/401 |

(Continued)

FOREIGN PATENT DOCUMENTS

| CN | 104011849 | 8/2014 |
| WO | 2014018201 A1 | 1/2014 |

OTHER PUBLICATIONS

International Searching Authority at the Korean Intellectual Property Office, International Search Report and Written Opinion for International Patent Application No. PCT/US2014/072396, dated Sep. 30, 2015, 15 pages.

(Continued)

*Primary Examiner* — Ori Nadav
(74) *Attorney, Agent, or Firm* — Schwabe, Williamson & Wyatt, P.C.

(57) ABSTRACT

Embodiments of the invention include nanowire and nanoribbon transistors and methods of forming such transistors. According to an embodiment, a method for forming a microelectronic device may include forming a multi-layer stack within a trench formed in a shallow trench isolation (STI) layer. The multi-layer stack may comprise at least a channel layer, a release layer formed below the channel layer, and a buffer layer formed below the channel layer. The STI layer may be recessed so that a top surface of the STI (Continued)

layer is below a top surface of the release layer. The exposed release layer from below the channel layer by selectively etching away the release layer relative to the channel layer.

16 Claims, 11 Drawing Sheets

(51) Int. Cl.
- *H01L 29/66* (2006.01)
- *H01L 29/78* (2006.01)
- *H01L 21/762* (2006.01)
- *H01L 29/267* (2006.01)
- *H01L 29/423* (2006.01)
- *H01L 29/786* (2006.01)
- *H01L 29/10* (2006.01)
- *H01L 29/04* (2006.01)

(52) U.S. Cl.
CPC ...... *H01L 29/0649* (2013.01); *H01L 29/1054* (2013.01); *H01L 29/205* (2013.01); *H01L 29/267* (2013.01); *H01L 29/42392* (2013.01); *H01L 29/66522* (2013.01); *H01L 29/66545* (2013.01); *H01L 29/66795* (2013.01); *H01L 29/785* (2013.01); *H01L 29/78696* (2013.01)

(58) Field of Classification Search
CPC ......... H01L 29/66522; H01L 29/66545; H01L 29/785; H01L 21/76224; H01L 29/1054; H01L 29/42392
USPC ..................................................... 257/27–33
See application file for complete search history.

(56) References Cited

U.S. PATENT DOCUMENTS

| | | | | |
|---|---|---|---|---|
| 10,229,997 | B2* | 3/2019 | Mohapatra | H01L 29/125 |
| 2004/0140536 | A1* | 7/2004 | Hidaka | H01L 21/76224 |
| | | | | 257/E21.546 |
| 2008/0079041 | A1 | 4/2008 | Suk et al. | |
| 2010/0295022 | A1 | 11/2010 | Chang et al. | |
| 2012/0319178 | A1 | 12/2012 | Chang et al. | |
| 2013/0161756 | A1* | 6/2013 | Glass | H01L 29/66545 |
| | | | | 257/369 |
| 2014/0054648 | A1* | 2/2014 | Itokawa | H01L 29/7853 |
| | | | | 257/192 |
| 2014/0091360 | A1 | 4/2014 | Pillarisetty et al. | |
| 2014/0225065 | A1* | 8/2014 | Rachmady | H01L 29/42392 |
| | | | | 257/24 |
| 2014/0329376 | A1* | 11/2014 | Sanchez | H01L 21/02546 |
| | | | | 438/492 |
| 2016/0293760 | A1* | 10/2016 | Glass | H01L 29/205 |
| 2018/0226496 | A1* | 8/2018 | Gardner | H01L 21/02381 |

OTHER PUBLICATIONS

Search Report for European Patent Application No. 14909265.2 dated Aug. 2, 2018, 7 pages.
International Preliminary Report on Patentablity for International Patent Application No. PCT/US2014/072396, dated Jul. 6, 2017, 12 pages.
Office Action for Taiwan Patent Application No. 104138545 dated Feb. 13, 2019, 16 pgs., with English translation.
Office Action for Chinese Patent Application No. 201480083605.X dated Jan. 2, 2020, 8 pgs.
Office Action for Chinese Patent Application No. 201480083605.X dated Jun. 22, 2020, 6 pgs.
Notice of Allowance for Taiwan Patent Application No. 104138545 dated Oct. 15, 2019, 3 pgs.
Office Action for Chinese Patent Application No. 201480083605.X dated Nov. 30, 2020, 8 pgs., no translation.
Office Action for Korean Patent Application No. 10-2017-7014127 dated Jul. 12, 2021, 4 pgs.
Office Action for Korean Patent Application No. 10-2017-7014127 dated Jan. 25, 2021, 8 pgs.
Notice of Allowance for Korean Patent Application No. 10-2017-7014127 dated Dec. 23, 2021, 4 pgs.

* cited by examiner

INGAAS EPI STRUCTURE AND WET ETCH PROCESS FOR ENABLING III-V GAA IN ART TRENCH

CROSS-REFERENCE TO RELATED APPLICATION

This patent application is a U.S. National Phase Application under 35 U.S.C. § 371 of International Application No. PCT/US2014/072396, filed Dec. 24, 2014, entitled INGAAS EPI STRUCTURE AND WET ETCH PROCESS FOR ENABLING III-V GAA IN ART TRENCH.

FIELD OF THE INVENTION

Embodiments generally relate to transistor devices. More specifically, embodiments relate to transistor devices formed with nanowires or nanoribbons.

BACKGROUND OF THE INVENTION

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

As the manufacture of integrated circuit devices, further reductions in scale may result in the need for even more advances transistor technologies, such as gate-all-around transistors. Many different techniques have been attempted to fabricate such three-dimensional isolated channel devices. However, issues, such as reducing the density of lattice defects in the channel are a significant problem. As such, improvements are needed in the area of nanowire channel gate-all-around manufacturing technologies.

DETAILED DESCRIPTION OF THE INVENTION

Described herein are systems that include transistor devices with nanowire or nanoribbon channels and methods of forming such devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
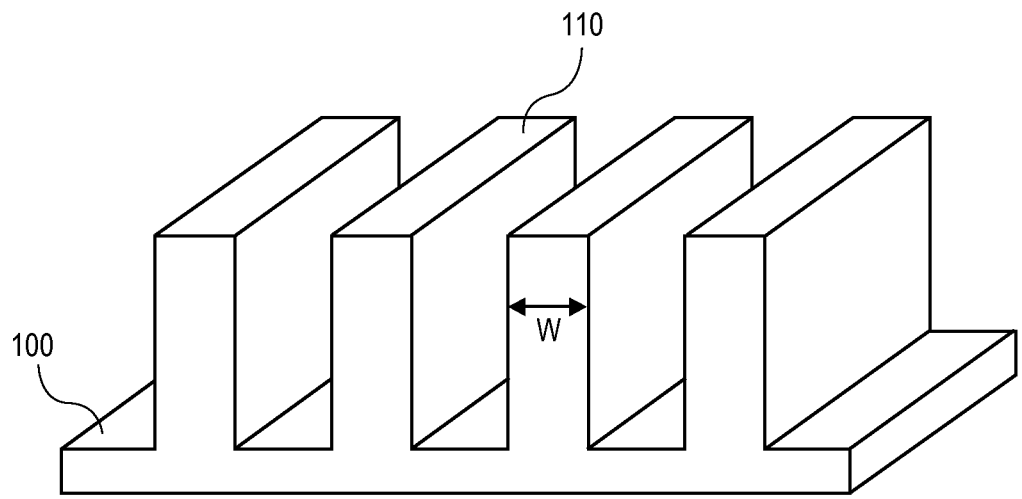
FIG. 1 illustrates a perspective view of device that includes a plurality of high aspect ratio fins formed on a substrate, according to an embodiment.

Referring now to FIG. 1, a substrate 100 with a plurality of fins 110 are illustrated. According to an embodiment, the substrate 100 may be a semiconductor substrate. In one implementation, the semiconductor substrate 100 may be a crystalline substrate formed using a bulk silicon or a silicon-on-insulator substructure. In other implementations, the semiconductor substrate 100 may be formed using alternate materials, which may or may not be combined with silicon, that include but are not limited to germanium, indium antimonide, lead telluride, indium arsenide, indium phosphide, gallium arsenide, indium gallium arsenide (e.g., $In_xGa_{1-x}As$ where x is between 0 and 1), gallium antimonide, or other combinations of group III-V or group IV materials. Although a few examples of materials from which the substrate 100 may be formed are described here, any material that may serve as a foundation upon which a semiconductor device may be built falls within the scope of the present invention.

According to an embodiment, the fins 110 may be the same material as the substrate 100. By way of example, the fins 110 may be high aspect ratio fins. In an embodiment the high aspect ratio fins may have a height to width ratio that is 2:1 or greater. An additional embodiment may include fins 110 that have a height to width ratio that is 10:1 or greater. In an embodiment, the width W of the fins 110 is chosen to have a width that is substantially equal to the desired width of a nanowire channel or nanoribbon channel that will subsequently be formed and explained in greater detail below. By way of example the width W may be less than 10 nm. According to another embodiment, the width W may be less than 5 nm. As illustrated, four fins 110 are shown, however, embodiments are not limited to such configurations. For example, there may be a single fin 110 formed on the substrate 100. Additional embodiments may include the formation of a plurality of fins 110 on the substrate.

Figure 2:
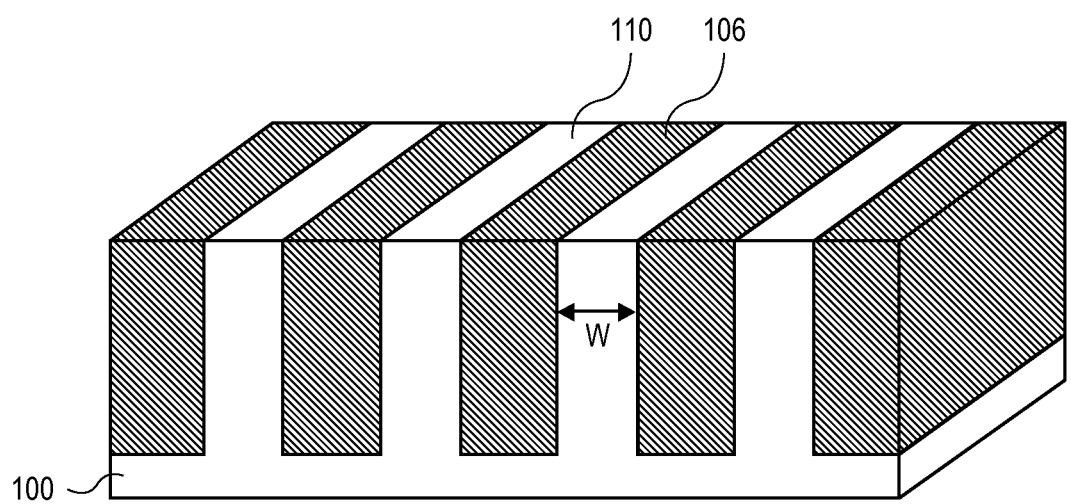
FIG. 2 illustrates a perspective view of the device after a shallow trench isolation (STI) layer is formed between each fin, according to an embodiment.

Referring now to FIG. 2, a shallow trench isolation (STI) layer 106 may be formed over the surface of the substrate 100 between the fins 110. In an embodiment, the STI layer is an insulating layer. For example, the STI layer 106 may be an oxide, such as a silicon oxide, or the like. According to an additional embodiment, the STI layer 106 may be include a plurality of dielectric materials. For example, a first dielectric material may be a conformal material and a second dielectric material may be a fill material. Embodiments include depositing the silicon oxide layer with a process such as a chemical vapor deposition (CVD) process or the like. In an embodiment, the STI layer 106 may be deposited to a height greater than a top surface of the fins 110, and thereafter planarized to expose the top surfaces of the fins 110. For example, the STI layer 106 may be planarized with a chemical-mechanical polishing (CMP) operation.

Figure 3:
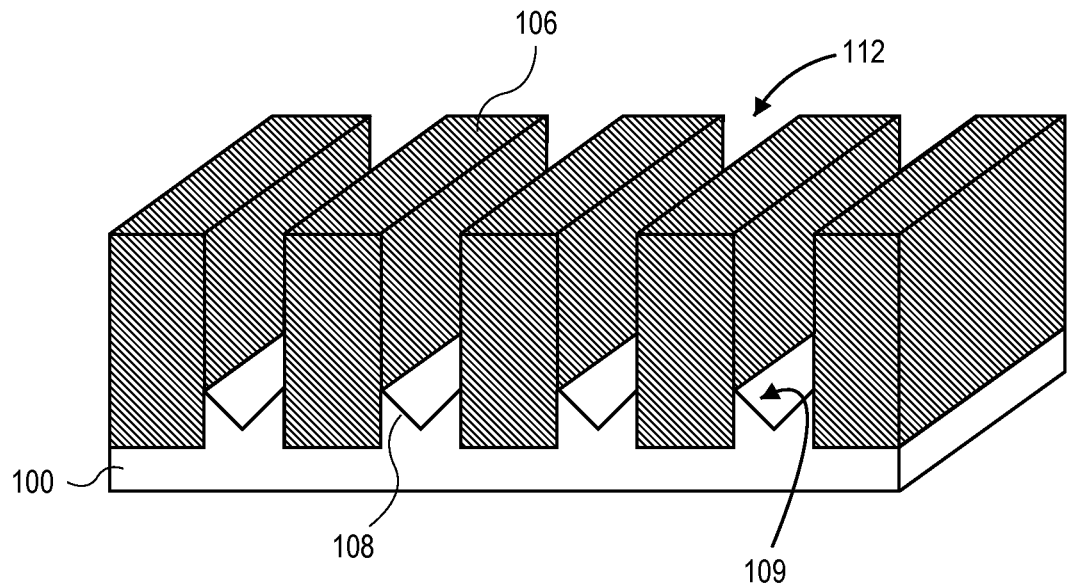
FIG. 3 illustrates a perspective view of the device after the high aspect ratio fins are recessed to form a plurality of aspect ratio trapping (ART) trenches, according to an embodiment.

Referring now to FIG. 3, the fins 110 are recessed to form an aspect ratio trapping (ART) trench 112. According to an embodiment, the fins 110 are not entirely removed during the recessing operation. In such an embodiment, a residual portion 108 of the fin may remain at the bottom of the ART trench 112. Embodiments of the invention may include a residual portion 108 that has a non-planar top surface. As illustrated, the top surface of the residual portion may be a notch 109 according to certain embodiments. For example, the notch 109 may be formed by an etching chemistry used during the recessing operation that selectively etches the fins 110 along a desired crystallographic plane. By way of example, the notch 109 may be formed by the <111> crystallographic plane that is selectively etched with commonly known wet-etching processes. According to an additional embodiment, the fins 110 may be recessed with two or more etching processes. By way of example, a first etch may be a dry etch, and the second etch may be a wet etch that forms the notch 109.

Figure 4:
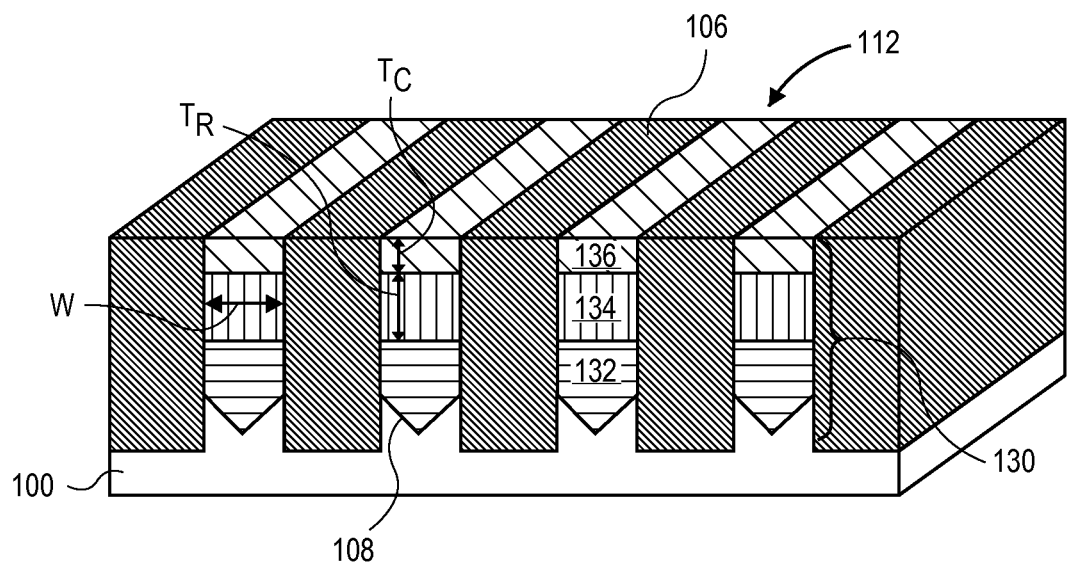
FIG. 4 illustrates a perspective view of the device after multi-layer stacks are formed in the ART trenches, according to an embodiment.

Referring now to FIG. 4, a multi-layer stack 130 is formed in the ART trench 112. The multi-layer stack 130 includes a plurality of individual layers. In the illustrated embodiment, the multi-layer stack 130 includes three distinct layers. The bottommost layer of the multi-layer stack 130 is a buffer layer 132. The buffer layer may be formed over the residual portion 108 of the fins. A release layer 134 may be formed over the buffer layer 132. A channel layer 136 may be formed over the release layer 134. While three layers are illustrated in FIG. 4, it is to be appreciated that as few as two layers or more than three layers may be included in the multi-layer stack 130. For example, the multilayer stack may further include seed layers, bilayers, or the like. Additional embodiments include a buffer layer 132 and a release layer 134 that are made from the same material. In such an embodiment, it may appear from a cross-sectional view that there are only two material layers in the multi-layer stack 130.

Forming the multi-layer stacks 130 in the ART trenches 112 allows for the epitaxial growth of each layer in the multi-layer stack to be confined. Confining the growth of the epitaxial layers has several benefits. One such benefit is that the width of the epitaxial layers will match the width W of the ART trench 112. As such, the plurality of multi-layer stacks 130 will have a predetermined width. Additionally, the ART trenches 112 trap dislocations formed in the epitaxially grown layers, as will be described in greater detail below. As such, upper portions of the multi-layer stacks 130 (e.g., the channel layer 136) may be substantially free of lattice defects.

In an embodiment, the buffer layer 132 may be epitaxially grown over the residual portion 108 of the fins. In embodiments that include a notch 109, the crystallographic plane that is exposed at the surface may be chosen to minimize the presence of defects during the growth of the buffer layer 134. Embodiments of the invention include a buffer layer 132 that is a different material than the residual portion 108 of the fin. By way of example, the residual portion 108 of the fin may be a silicon or polysilicon material and the buffer layer 132 may be a III-V semiconductor material. In embodiments, the buffer layer 132 may be epitaxially grown with an atomic layer deposition (ALD), metalorganic chemical vapor deposition (MOCVD), or chemical vapor deposition (CVD) processes.

The high aspect ratios of the ART trenches may prevent the use of materials that have poor fill characteristics. For example, when a material is deposited in a high aspect ratio trench, the resulting layer may have a significant number of voids and/or other defects. Accordingly, embodiments of the invention include materials for the buffer layer 132 that may be epitaxially grown at the bottom of a high aspect ratio trench without the formation of a significant number of voids or other defects. By way of example, suitable III-V semiconducting materials that have satisfactory fill properties in high aspect ratio trenches may include gallium arsenide (GaAs), poly-GaAs, InP, and $In_xGa_{1-x}As$ where x is between 0 and 1. Additional materials that may be used for the buffer layer 132 may include AlAs, GaP, AlAsSb, and InAlAs. Since the buffer layer 132 has filled a portion of the ART trench 112, the aspect ratio of the ART trench 112 has been reduced. By way of example, the aspect ratio of the ART trench 112 may be reduced by approximately twenty-five percent or more. According to an additional embodiment, the buffer layer 132 may be sufficiently thick to remove defects from the multi-layer stack 130.

In an embodiment, a release layer 134 is epitaxially grown over the buffer layer 132. By way of example, the release layer may be formed with an ALD, MOCVD, CVD, or molecular beam epitaxy (MBE) process. Since the aspect ratio of the ART trench 112 has been reduced by the formation of the buffer layer 132, there is greater flexibility in the material that may be chosen for use in the release layer 134. As such, the material used for the release layer may be chosen based on its etch selectivity to the material used for the channel layer 136. In an embodiment, the release layer may be indium phosphide (InP) and the channel layer 136 may be indium-gallium-arsenide (InGaAs). By way of example, a wet etchant that includes a mixture of HCl and $H_2SO_4$ may selectively etch the InP release layer 134 over the InGaAs channel layer 136. While IP and InGaAs are used as exemplary embodiments, it is to be appreciated that any number of material combinations may be used so long as the channel layer 136 and the release layer 134 are selectively etched with respect to each other. For example, GaAs may be the release layer 134 and InGaAs may be the channel layer 136, when Indium accounts for approximately 20% or more of the atomic volume of the material.

According to an embodiment, the release layer 134 may provide a substantially defect free surface on which the channel layer 136 may be grown. According to an embodiment, the thickness $T_R$ of the release layer 134 may be chosen such that a top surface of the release layer 134 is substantially free from defects. Defects, such as dislocations and stacking faults may be present in the bottom portion of the release layer 134 because there may be a lattice mismatch between the materials used for the buffer layer 132 and release layer 134. As the thickness of the release layer increases during the deposition process, the dislocations travel along slip planes until they run into the sidewalls of the ART trench 112. Once the dislocations reach the sidewalls of the trench, they are trapped and are prevented from spreading further. Accordingly, the upper portion of the release layer 134 may be substantially free of defects. Embodiments are able to adequately remove the defects from the release layer 134 when the aspect ratio of the thickness $T_R$ to width W of the release layer is approximately 3:2 or greater. By way of example, when the width W of the release layer 134 is approximately 10 nm, then a thickness $T_R$ of approximately 15 nm or greater would result in the formation of a release layer 134 that has an upper portion that is substantially free from defects.

After the buffer layer 134 is formed, the channel layer 136 may be formed over the top surface of the buffer layer 134. By way of example, the channel layer 136 may be formed with an ALD, MOCVD, CVD, or MBE process. In an embodiment, the width of the channel layer 136 is confined by the sidewalls of the ART trench 112 until the channel layer 136 begins to grow above the trench 112. After the channel layer 136 grows beyond the trench, the width of the layer may begin to grow since it is no longer confined. Accordingly, embodiments of the invention, may include a planarization process. The planarization process may remove any overgrowth of the channel layer 136 that has extended out of the ART trench 112 and above the top surface of the STI layer 106. For example, top surfaces of the channel layer 136 and the STI layer 106 may be planarized with a CMP process.

In an embodiment, the planarization process may also be used to reduce the thickness $T_C$ of the channel layer 136 to be approximately equal to the desired thickness of a nanowire or nanoribbon that will be subsequently formed. As used herein, a nanowire channel layer 136 may be a channel layer that has a thickness $T_C$ that is substantially equal to its width W. By way of example a nanowire may have dimensions for the width W and the thickness $T_C$ that are less than 15 nm. In an embodiment, the width W and thickness $T_C$ may be between approximately 2 nm and 10 nm. Alternative embodiments may utilize a nanoribbon channel layer 136. As used herein, a nanoribbon channel layer 136 may have a width W that is larger than its thickness $T_C$. Alternatively, embodiments may include a nanoribbon channel layer 136 that may have a thickness $T_C$ that is greater than its width W. By way of example a nanoribbon channel layer 136 may have dimensions for the width W and the thickness $T_C$ that are less than 15 nm. In an embodiment, the width W and thickness $T_C$ of the nanoribbon channel layer 136 may be between approximately 2 nm and 10 nm. In an embodiment, the width W and thickness $T_C$ of the nanoribbon channel layer 136 may be a several (e.g., less than five monolayers thick).

Figure 5:
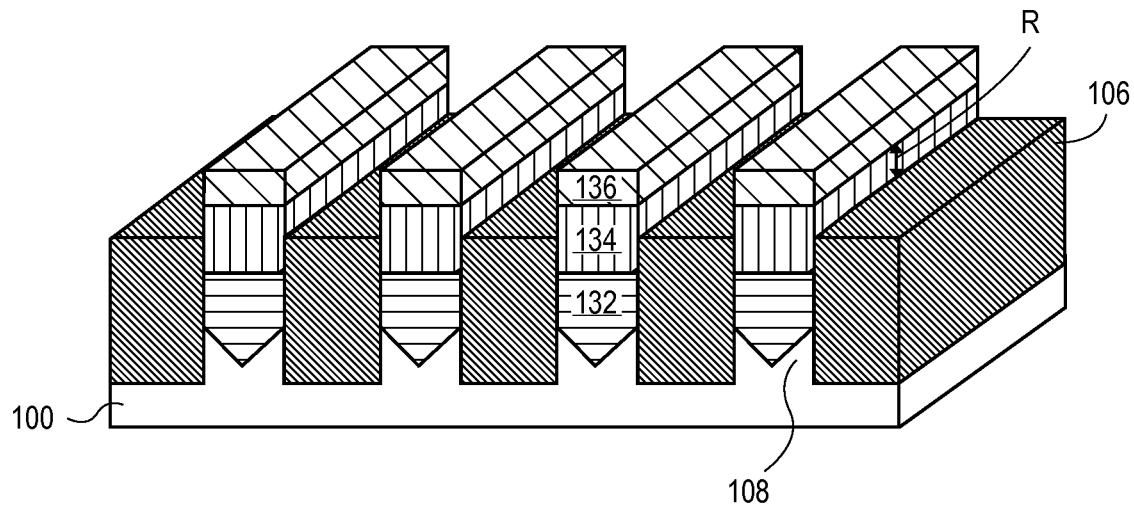
FIG. 5 illustrates a perspective view of the device after the STI layer is recessed to expose a release layer within the multi-layer stacks, according to an embodiment.

Referring now to FIG. 5, the STI layer 106 may be recessed. In an embodiment, the STI layer 106 is recessed below a bottom surface of the nanowire channel layer 136. For example, the recessed STI layer 106 may have a top surface that is below a top surface of the release layer 134. According to an embodiment, the recess distance R below the top surface of the release layer 134 is chosen to allow enough of the release layer 134 to be exposed in order for an etchant to selectively remove the release layer 134 during a subsequent etching process that is described in greater detail below. Additionally, there needs to be sufficient room between a bottom surface of the channel layer 136 and the top surface of the STI layer 106 to form a gate dielectric and a gate electrode around the surfaces of the nanowire channel layer 136 after the release layer 134 is removed. For example, the STI layer 106 may be recessed a distance R below the top surface of the release layer 134 that is approximately 2 nm or greater. According to an additional embodiment, the top surface of the STI layer 106 may be between approximately 3 nm and 5 nm below the top surface of the release layer 134.

Figure 6:
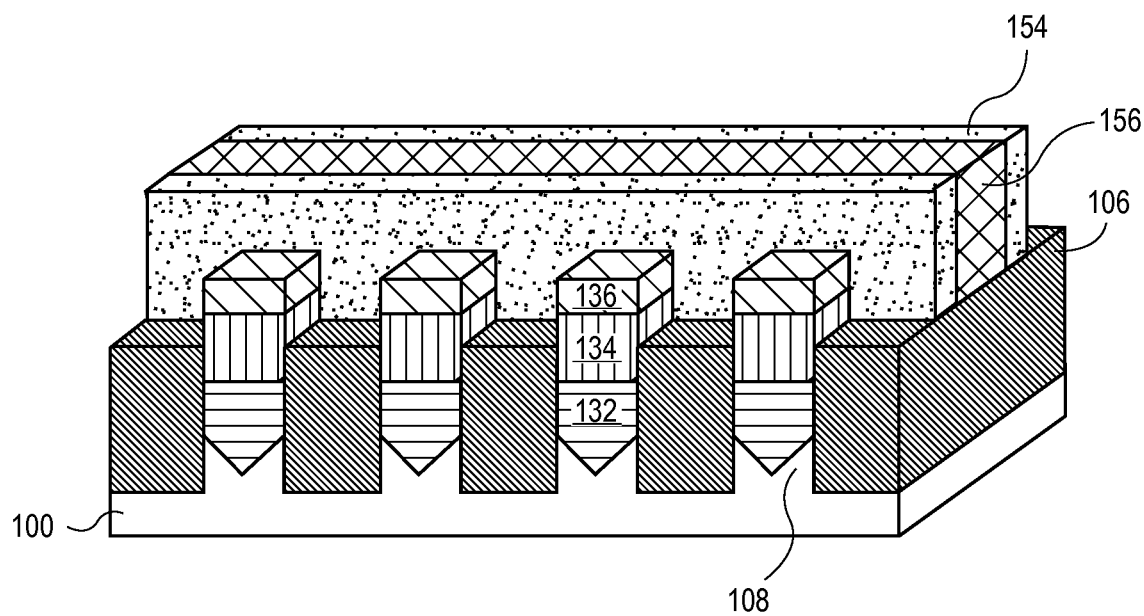
FIG. 6 illustrates a perspective view of the device after a sacrificial gate electrode and sidewall spacers are formed over each of the multi-layer stacks, according to an embodiment.

Referring to FIG. 6, a sacrificial gate electrode 156 is formed over the channel region of the multi-layer stack 130. A layer of the material used to form the sacrificial gate electrode 156 may be blanket deposited over the exposed surfaces and patterned to form the sacrificial gate electrode 156. The use of a sacrificial gate electrode 156 protects the portion of the multi-layer stack 130 (more specifically the portion of the nanowire channel layer 136) that will become the nanowire channel of the finished device from being damaged or etched away during subsequent processing operations.

Additionally, a pair of sidewall spacers 154 may be formed on opposite sidewalls of sacrificial gate electrode 156. The pair of sidewall spacers 154 may be formed using conventional methods of forming sidewall spacers known in the art. In an embodiment, a conformal dielectric spacer layer, such as, but not limited to, silicon oxide, silicon nitride, silicon oxynitride and combinations thereof, is first blanket deposited on all structures, including the multi-layer stack 130 and sacrificial gate electrode 156. The dielectric spacer layer may be deposited using conventional CVD methods such as low pressure chemical vapor deposition (LPCVD), plasma enhanced chemical vapor deposition (PECVD), and atomic layer deposition (ALD). In an embodiment, the dielectric spacer layer is deposited to a thickness of between approximately 2 and 10 nm. Thereafter, a commonly known spacer-etching process may be used to remove the excess dielectric material and leave behind the sidewall spacers 156.

Figure 7:
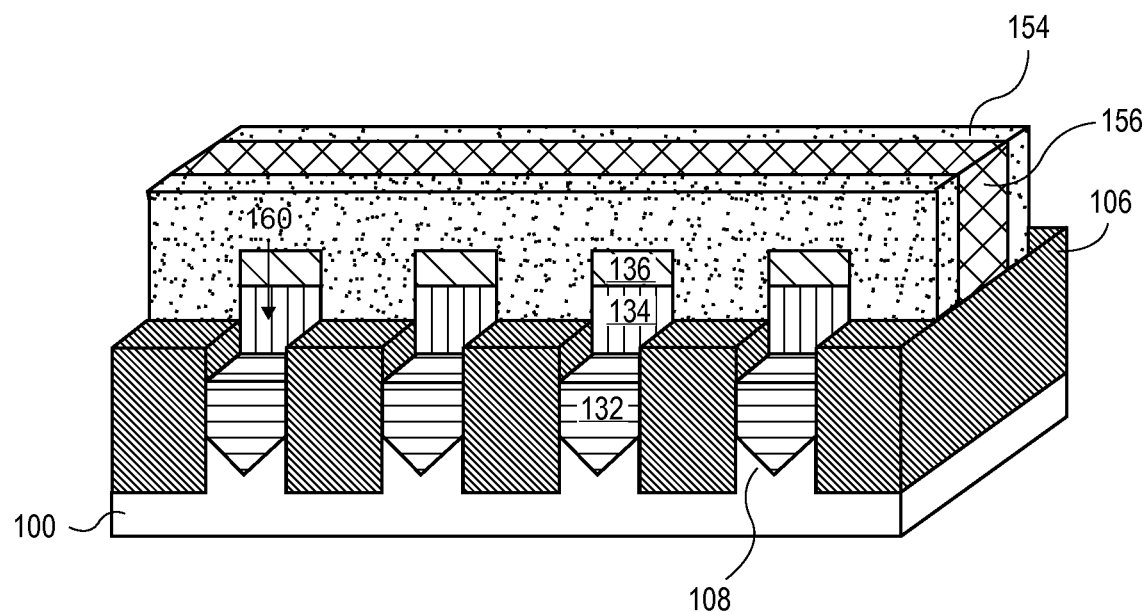
FIG. 7 illustrates a perspective view of the device after portions of the multi-layer stack are recessed to form replacement source/drain (S/D) trenches, according to an embodiment.

Referring to FIG. 7, the portions of the multi-layer stack 130 that are not covered and protected by the sacrificial gate electrode 156 and the sidewall spacers 154 are recessed to form a source/drain (S/D) trench 160. The multi-layer stack 130 may be recessed with convention etching methods such as wet etching or plasma dry etching. Since the multi-layer stack 130 comprises layers of different materials, one or more different etching processes may be utilized in order to remove each layer. In an embodiment, the channel layer 136 and the release layer 134 are completely removed to expose a top surface of the buffer layer 132. In an embodiment, the S/D trench 160 is formed to a depth of between approximately 20 and 40 nm. According to an additional embodiment, a portion of the release layer 134 may remain. For example, the top surface of the multi-layer stack 130 may remain above or substantially planar with a top surface of the STI layer 106. In an additional embodiment, the recessing process may completely remove the exposed portions of the multi-layer stack 130 and leave the substrate 100 exposed.

Figure 8:
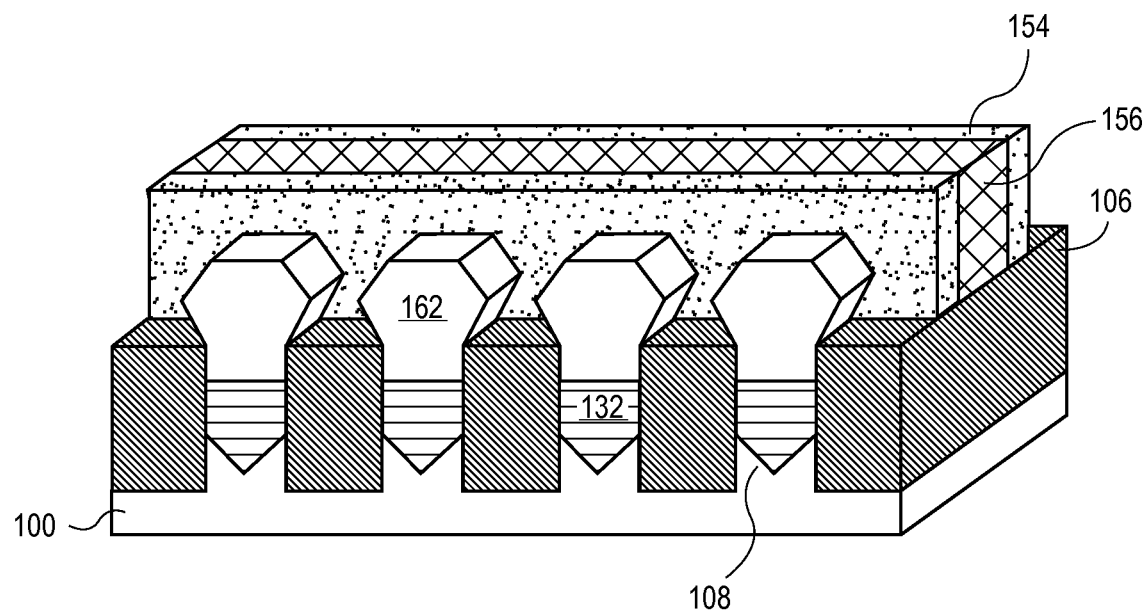
FIG. 8 illustrates a perspective view of the device after a replacement S/D region is formed in the S/D trenches.

Thereafter, replacement S/D regions 162 may be formed in the S/D trenches 160, as illustrated in FIG. 8. In an embodiment, the replacement S/D regions 162 are formed using conventional epitaxial deposition methods such as low pressure chemical vapor deposition, vapor phase epitaxy, and molecular beam epitaxy. In an embodiment, the replacement S/D regions 162 mechanically and electrically couple with the portions of the multi-layer stack 130 that are formed below the sacrificial gate electrode 156 and the sidewall spacers 154. As the replacement S/D regions 162 extend above the STI layer 106, the growth is no longer confined, and the S/D regions 162 may begin expanding laterally towards each other. In an embodiment, the multi-layer stacks are formed with a pitch that is large enough to prevent the replacement S/D regions 162 from merging together, as illustrated in FIG. 8. According to an additional embodiment, the replacement S/D regions 162 are allowed to merge with each other.

In certain embodiments, the replacement S/D regions 162 may be formed using a silicon alloy such as silicon germanium or silicon carbide. In some implementations the epitaxially deposited silicon alloy may be doped in situ with dopants such as boron, arsenic, or phosphorous. In further embodiments, the replacement S/D regions 162 may be formed using one or more alternate semiconductor materials such as germanium or a group III-V material or alloy. And in further embodiments, one or more layers of metal and/or metal alloys may be used to form the replacement S/D regions 162. Embodiments may include a replacement S/D region that has a higher conductivity than the multi-layer stack 130, and therefore may produce a more efficient device While FIGS. 7 and 8 illustrate the use of a replacement S/D regions 162 that are formed by etching away the exposed portions of the multi-layer stack 130 and then epitaxially growing or depositing replacement S/D regions 162, embodiments of the invention are not limited to such configurations. For example, the exposed portions of the multi-layer stack 130 may not be etched away and are, instead, maintained to form the source and drain regions for the device. In such embodiments, the exposed portions of the multi-layer stack 130 may be doped after the formation of the sacrificial gate electrode 156 and the sidewall spacers 154. The doping may be performed with well-known techniques, such as ion implantation to form source and drain regions of a desired conductivity type and concentration level.

Figure 9:
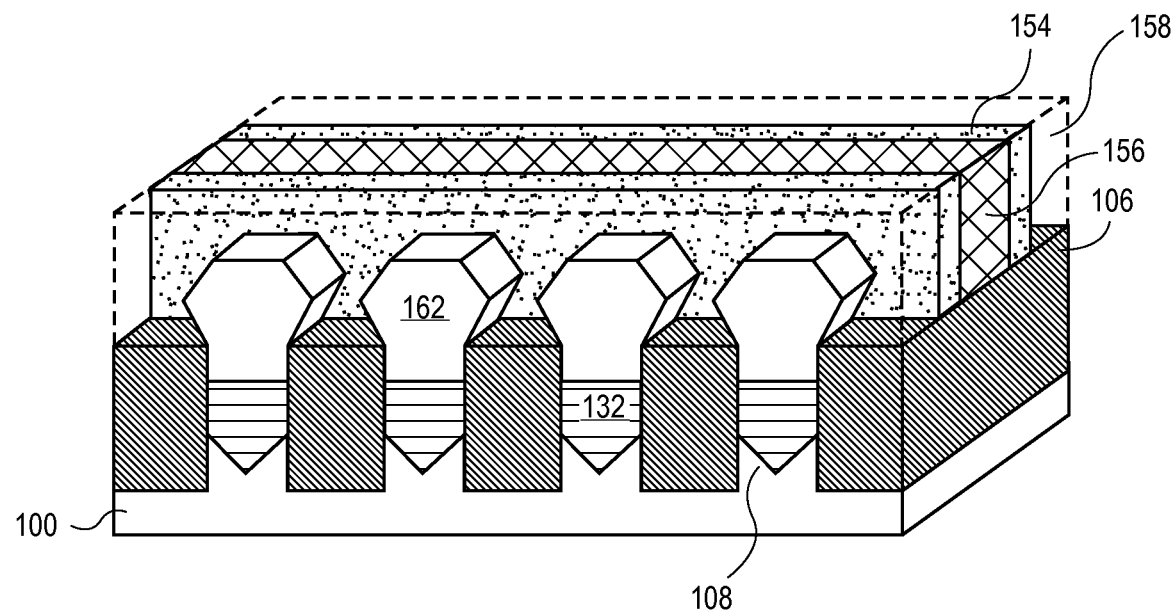
FIG. 9 illustrates a perspective view of the device after an interlayer dielectric (ILD) is formed over the exposed surfaces, according to an embodiment.

After the formation of the replacement S/D regions 162, an inter-layer dielectric (ILD) layer 158 is blanket deposited over the exposed surfaces, including the replacement S/D regions 162, the sacrificial gate electrode 156, and the pair of sidewall spacers 154. The blanket ILD layer 158 is illustrated as a dashed line in FIG. 9 to not unnecessarily obstruct the view of the other features. By way of example, the ILD layer 158 may be deposited using a conventional technique, such as CVD. In an embodiment, ILD layer 158 may be any dielectric material such as, but not limited to undoped silicon oxide, doped silicon oxide (e.g., BPSG, PSG), silicon nitride, and silicon oxynitride. After ILD layer 158 is deposited, any overburden may then be polished back using a conventional chemical mechanical planarization method to expose a top surface of the sacrificial gate electrode 156 and top surfaces of the pair of sidewall spacers 154.

Figure 10:
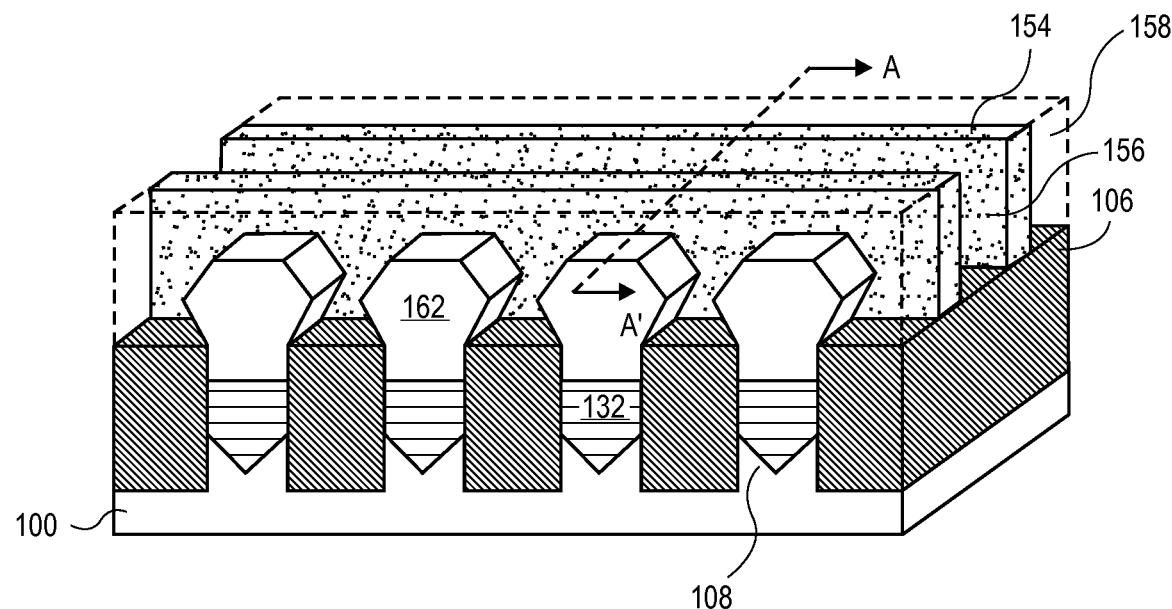
FIG. 10 illustrates a perspective view of the device after the sacrificial gate electrode is removed, according to an embodiment.
Figure 11A:
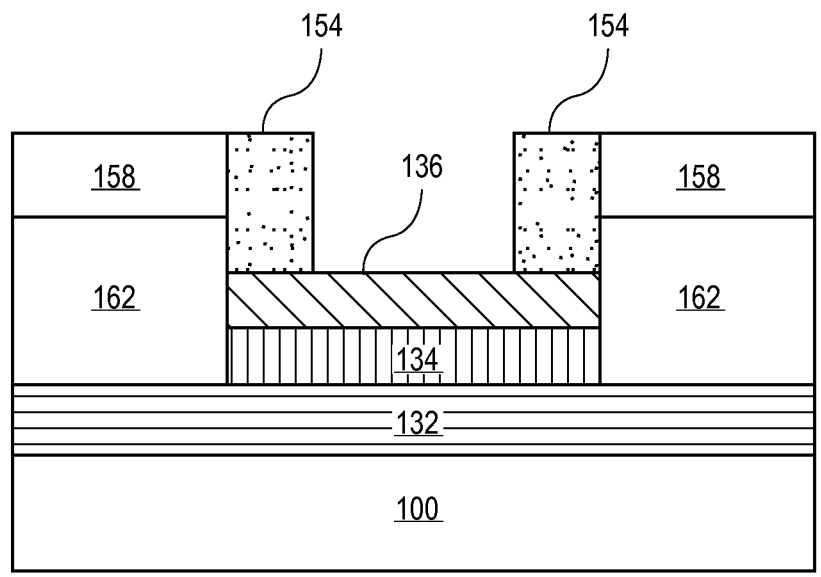
FIG. 11A illustrates a cross-sectional view of the device illustrated in FIG. 10 along the line A-A', according to an embodiment.

Thereafter, the sacrificial gate electrode 156 may be removed to expose the channel region of the multi-layer stack 130, as illustrated in FIG. 10. In order to more clearly illustrate and described the remaining processing operations, FIGS. 11A-11E are used to show two-dimensional cross-sectional illustrations along line A-A' in FIG. 10. FIG. 11A is a cross-sectional illustration of transistor device that corresponds to FIG. 10. As illustrated, the ILD layer 158 protects the replacement S/D regions 162 during the removal of the sacrificial gate electrode 156. Sacrificial gate electrode 156 may be removed using a conventional etching method such a plasma dry etch or a wet etch. In an embodiment where sacrificial gate electrode 156 is polysilicon and ILD layer 158 is silicon oxide, a wet etchant such as a TMAH solution may be used to selectively remove the sacrificial gate electrode 156.

Figure 11B:
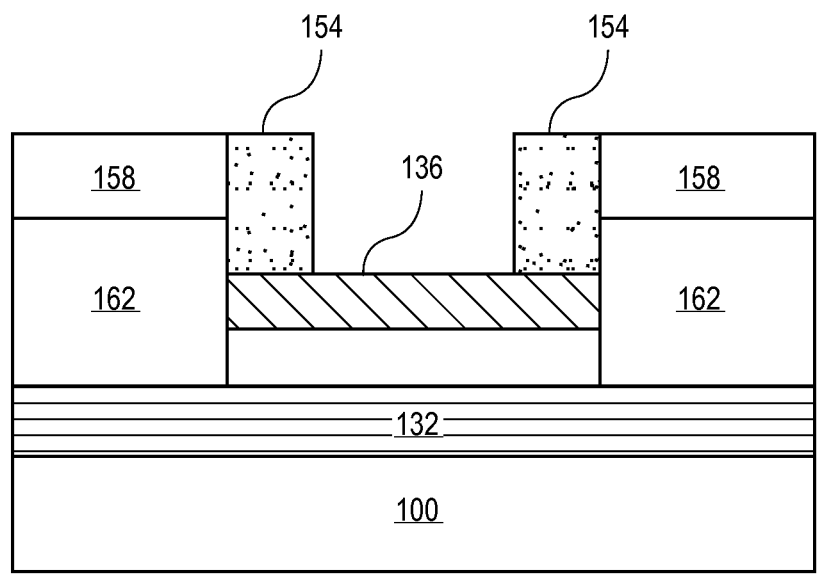
FIG. 11B illustrates a cross-sectional view of the device after the release layer is removed from the multi-layer stack, according to an embodiment.

Referring to FIG. 11B, the release layer 134 may be selectively etched away to release the nanowire channel 136 from the multi-layer stack 130. The release layer 134 may be removed using any well-known etchant that selectively removes the release layer 134 at a significantly higher rate than the nanowire channel 136. By way of example, a wet etchant that includes a mixture of HCl and $H_2SO_4$ may selectively etch an InP release layer 134 over an InGaAs nanowire channel 136. The removal of the release layer 134 results in the formation of a gap between the nanowire channel 136 and the buffer layer 132. According to an embodiment, the gap between the nanowire channel 136 and the buffer layer 132 is large enough to allow a gate dielectric material and the gate electrode to be formed between them. By way of example, the gap may have a thickness that is between approximately 5 and 30 nm.

Figure 11C:
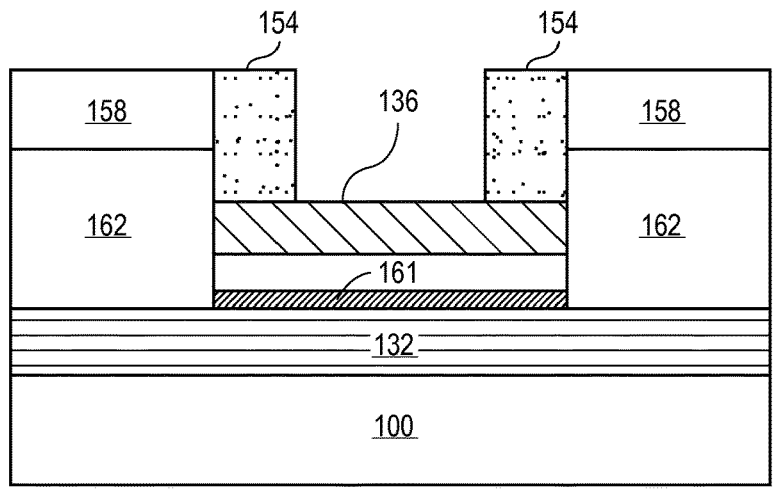
FIG. 11C illustrates a cross-sectional view of the device after a bottom gate isolation material is formed over the portion of the buffer layer between the sidewall spacers, according to an embodiment.

Referring to FIG. 11C, a bottom gate isolation 161 may be formed over the exposed portion of the buffer layer 132. By way of example, the bottom gate isolation 161 is formed by first blanket depositing a dielectric layer around and over the nanowire layer 136, and then using an etching process known in the art to etch back the layer until it is the desired thickness. By way of example, the thickness of the bottom gate isolation layer 161 is chosen such that the bottom gate isolation layer 161 isolates the top surface of the buffer layer 132 from capacitively coupling with the gate electrode 170.

By way of example, the thickness of bottom gate isolation 161 is between about 100-300 Å. According to an additional embodiment, the bottom gate isolation 161 may be omitted when the buffer layer 132 is a semi-insulating (e.g., wide bandgap with a large band offset).

Figure 11D:
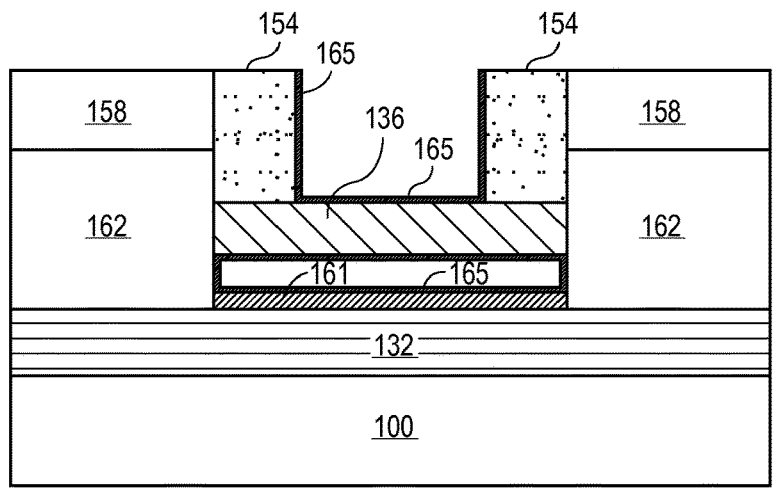
FIG. 11D illustrates a cross-sectional view of the device after a gate dielectric is applied to the exposed surfaces of the nanowire channel, according to an embodiment.

Referring now to FIG. 11D, a gate dielectric layer 165 is formed over the exposed surfaces of the nanowire layer 136. According to an embodiment, the gate dielectric layer 165 may also form along the exposed sidewalls of the replacement S/D regions 162, along the sidewall spacers 154, and the bottom gate isolation 161. Gate dielectric layer 165 may be formed from any well-known gate dielectric material such as, but not limited to silicon oxide, silicon nitride, hafnium oxide, and silicon oxynitride. In an embodiment, the gate dielectric layer 165 is deposited to a thickness between approximately 1-6 nm. Ideally, the gate dielectric layer 165 is formed using a highly conformal deposition method such as low pressure chemical vapor deposition (LPCVD), atomic layer deposition (ALD), or spin-on-dielectric process.

Next, a gate electrode material is blanket deposited on the gate dielectric layer 165 to form gate electrode 170. Gate electrode 170 may be formed from any well-known gate electrode material. In an embodiment the gate electrode 170 may consist of at least one P-type workfunction metal or N-type workfunction metal, depending on whether the transistor is to be a PMOS or an NMOS transistor. In some implementations, the gate electrode 170 may consist of a stack of two or more metal layers, where one or more metal layers are workfunction metal layers and at least one metal layer is a fill metal layer.

For a PMOS transistor, metals that may be used for the gate electrode 170 include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode 170 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode 170 with a workfunction that is between about 3.9 eV and about 4.2 eV.

Figure 11E:
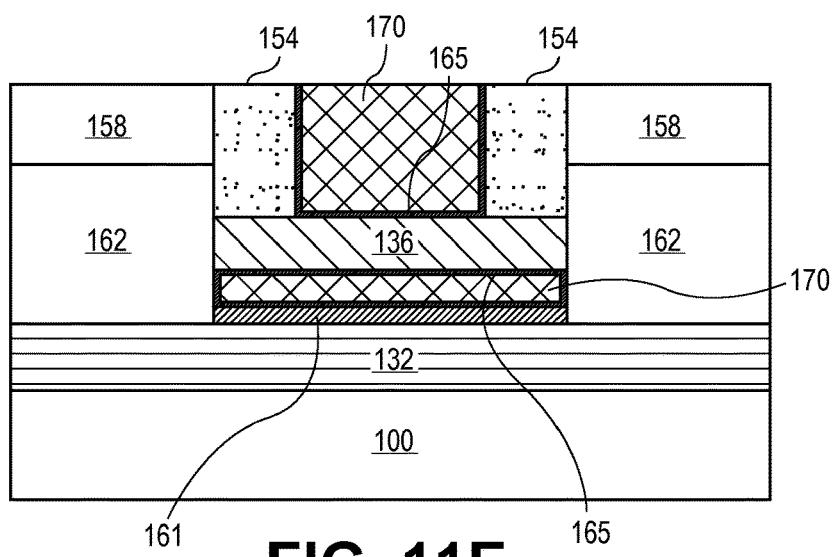
FIG. 11E illustrates a cross-sectional view of the device after a gate electrode is formed between the sidewall spacers and surrounds the nanowire channel, according to an embodiment.

According to an embodiment, the gate electrode 170 is deposited using a conformal deposition process such as atomic layer deposition (ALD) to ensure that gate electrode 170 is formed on the gate dielectric layer 165 and around the nanowire layer 136. The blanket gate electrode material may then be chemically mechanically planarized until the top surface of the ILD layer 158 is revealed as illustrated in FIG. 11E. The resultant transistor device formed using the method described is a non-planar gate all-around device with a nanowire channel, in accordance with an embodiment of the present invention.

Figure 12A:
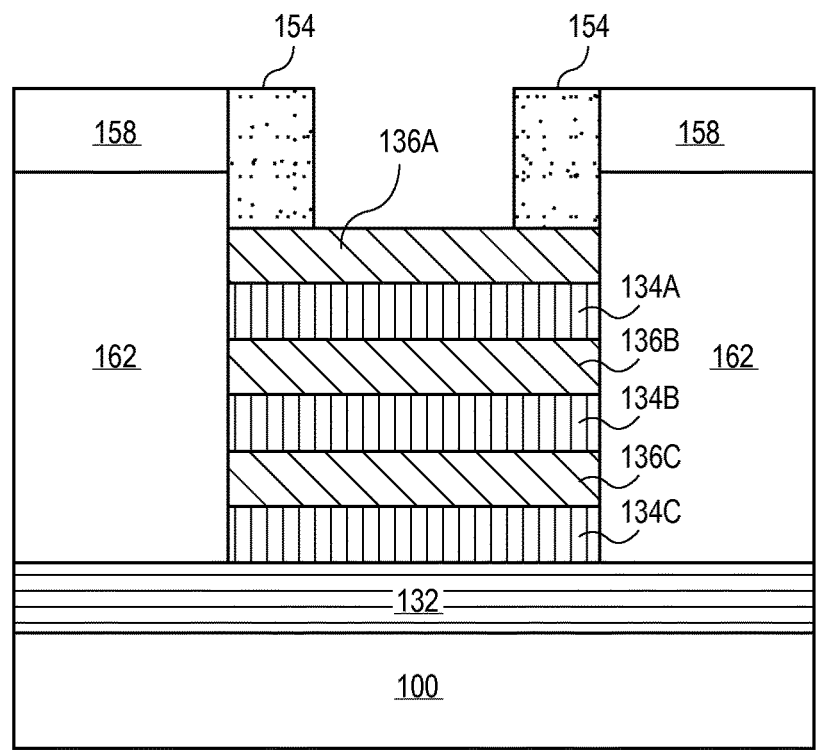
FIGS. 12A-12D illustrate a cross-sectional view of various processing operations for forming a device that includes a plurality of nanowire channels vertically aligned between S/D regions, according to an embodiment.

Referring now to FIGS. 12A-12D, cross-sectional illustration of device in various stages of processing are shown according to an additional embodiment of the invention. In FIG. 12A the transistor device illustrated is substantially similar to transistor device illustrated in FIG. 11A, with the exception that the multi-layer stack 130 includes three nanowire channel layers 136A, 136B, and 136C. As illustrated, release layers 134A, 134B, and 134C separate each of the nanowire channels 136 from each other. Such an embodiment may allow for a plurality of nanowires or nano-ribbons to be formed between each replacement S/D region 162 of a transistor device. In an embodiment, each of the channel layers 136A, 136B, 136C are formed with substantially similar dimensions, however, embodiments are not limited to such configurations. For example, a first channel layer 136A may have a greater thickness than the other channel layers 136B and 136C. Additional embodiments include a plurality of channel layers 136 that are each formed to a different thickness. While three nanowire channel layers are illustrated in FIG. 12A, it is to be appreciated that embodiments may also include two nanowire channel layers 136, or more than three nanowire channel layers 136. Aside from the alteration to the layers used to form the multi-layer stack 130, the processing necessary to form the device illustrated in FIG. 12A may be substantially similar to the processing described in detail above with respect to FIGS. 1-10, and will therefore, not be repeated here.

Figure 12B:
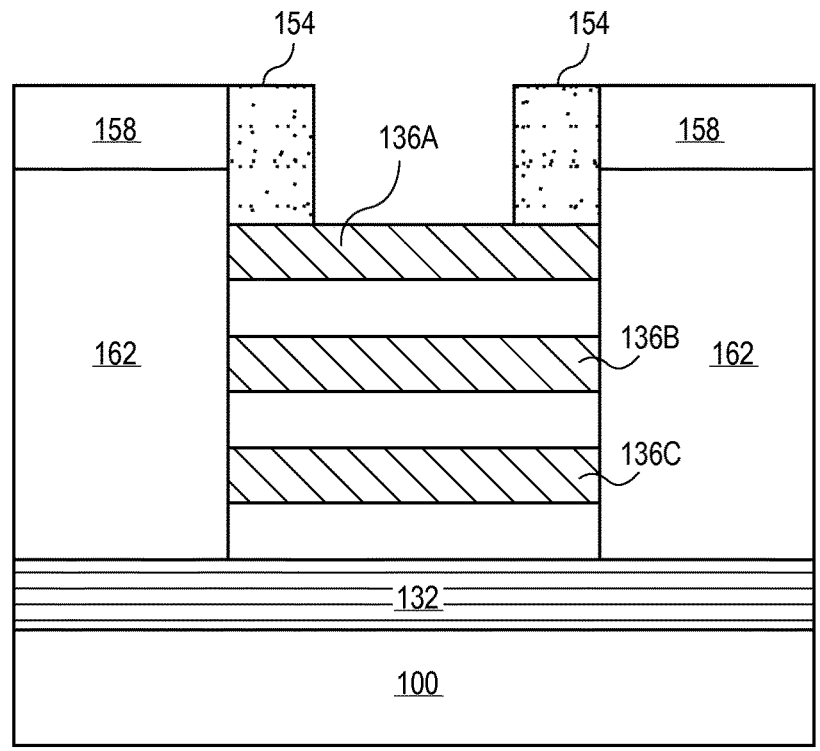

Referring now to FIG. 12B, the release layers 134A, 134B, and 134C may be selectively etched away to form nanowire channels 136. The release layer 134 may be removed using any well-known etchant that selectively removes the release layers 134 at a significantly higher rate than the nanowire channel 136. By way of example, a wet etchant that includes a mixture of HCl and $H_2SO_4$ may selectively etch an InP release layer 134 over an InGaAs channel layer 136. The removal of the release layer 134 results in the formation of a gap between the nanowire channel layer 136 and the buffer layer 132. According to an embodiment, the gaps between each of the nanowire channels 136 is large enough to allow a gate dielectric material and the gate electrode to be formed between them. By way of example, the gap may have a thickness that is between approximately 5 and 30 nm. In an embodiment, the etching process may be a anisotropic etch, and a portion of the release layer 134 below the spacers 154 may remain in the finished device.

As illustrated, the remaining nanowire channels 136 form a vertical array of nanowire channels that are mechanically and electrically coupled to the replacement S/D regions 162. In an embodiment, the nanowires channels 136 run parallel the ART trench and are aligned with each other to form a single column of nanowire channels 136, with a bottommost nanowire channel 136C at the very bottom of the column.

Figure 12C:
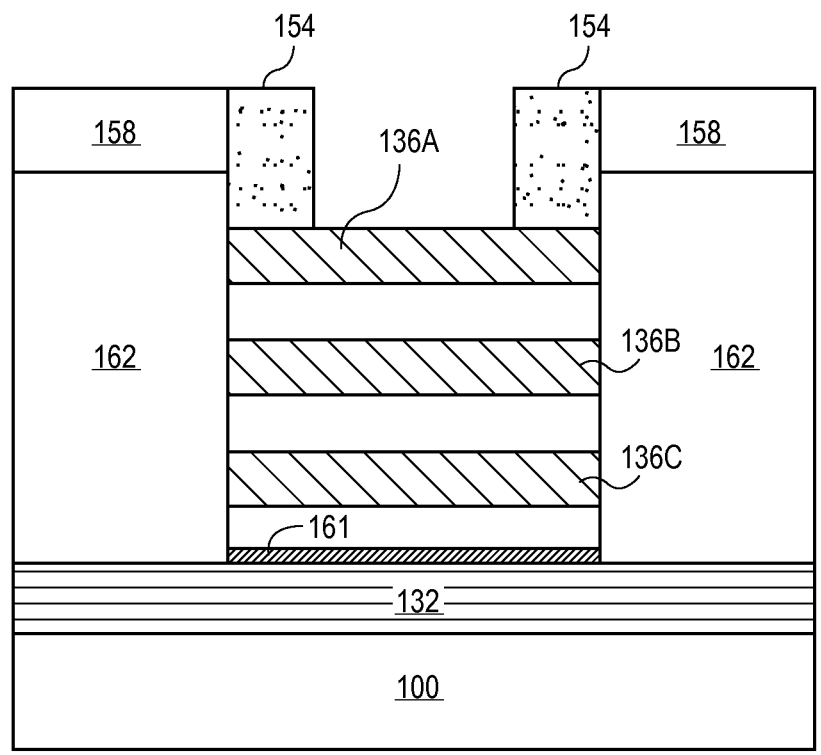

Referring to FIG. 12C, a bottom gate isolation 161 may be formed over the exposed portion of the buffer layer 132. By way of example, the bottom gate isolation 161 is formed by first blanket depositing a dielectric layer around and over the nanowire layer 136, and then using an etching process known in the art to etch back the layer until it is the desired thickness. According to an embodiment, the bottom gate isolation 161 illustrated in FIG. 12C is substantially similar to the bottom gate isolation 161 described in greater detail with respect to FIG. 11C.

Figure 12D:
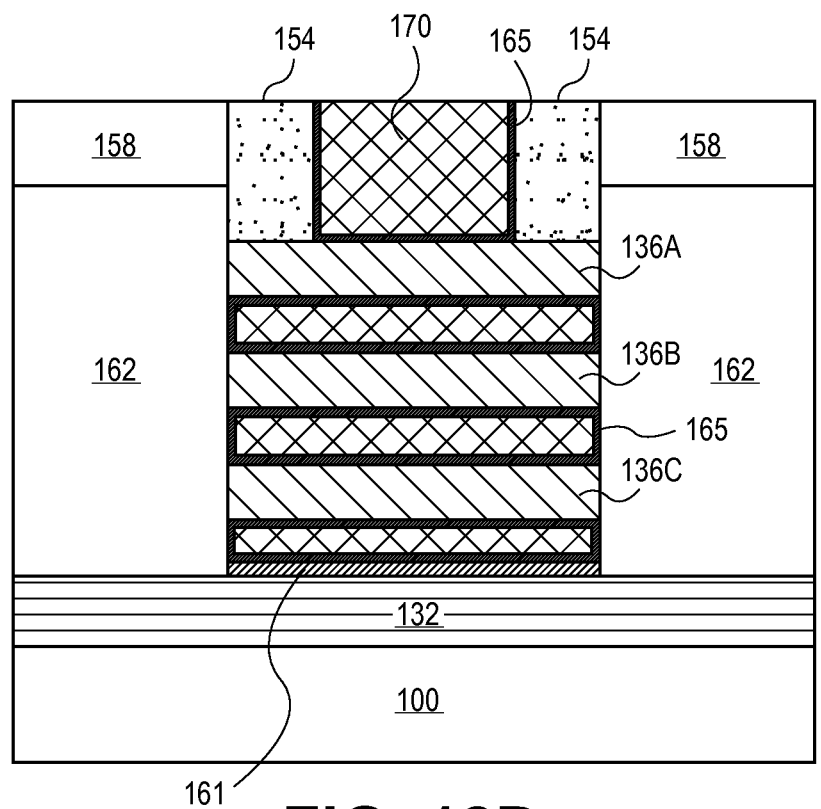

Referring now to FIG. 12D, a gate dielectric layer 165 is formed over the exposed surfaces of the nanowire channels 136A, 136B, and 136C. According to an embodiment, the gate dielectric layer 165 may also form along the exposed sidewalls of the replacement S/D regions 162, along the sidewall spacers 154, and the bottom gate isolation 161. Gate dielectric layer 165 may be formed from any well-known gate dielectric material such as, but not limited to silicon oxide, silicon nitride, hafnium oxide, and silicon oxynitride. In an embodiment, the gate dielectric layer is deposited to a thickness between approximately 1-6 nm. Ideally, the gate dielectric layer 165 is formed using a highly conformal deposition method such as low pressure chemical vapor deposition (LPCVD), atomic layer deposition (ALD), or spin-on-dielectric process.

Next, a gate electrode material is blanket deposited on the gate dielectric layer 165 to form gate electrode 170. Gate electrode 170 may be formed from any well-known gate electrode material, such as those described above. According to an embodiment, the gate electrode 170 is deposited using a conformal deposition process such as atomic layer deposition (ALD) to ensure that gate electrode 170 is formed on the gate dielectric layer 165 and around the surfaces of each of the nanowire channels 136. The blanket gate electrode material may then be chemically mechanically planarized until the top surface of the ILD layer 158 is revealed as illustrated in FIG. 12D. The resultant transistor device formed using the method described is a non-planar gate all-around device with a plurality of nanowire channels, in accordance with an embodiment of the present invention.

Figure 13:
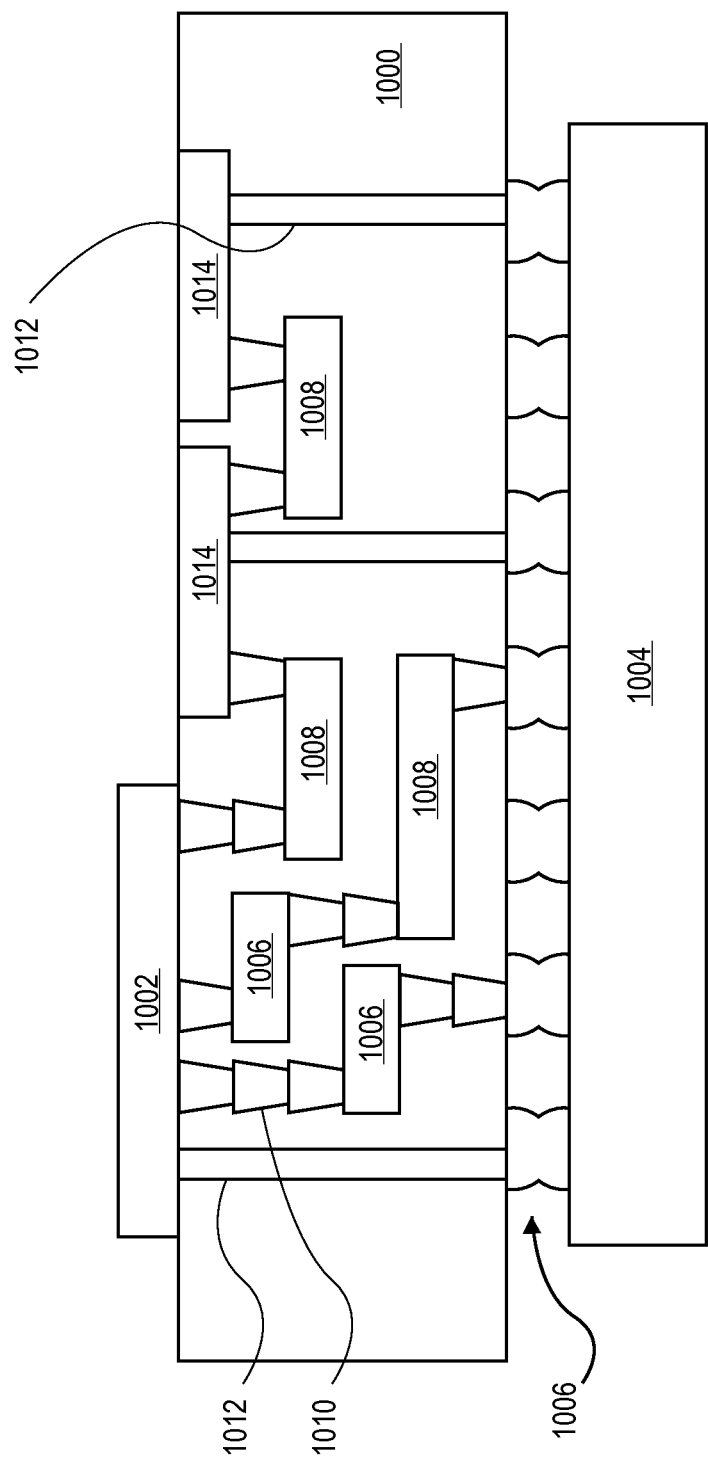
FIG. 13 is a cross-sectional illustration of an interposer implementing one or more embodiments of the invention.

FIG. 13 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/ 1004 are attached to opposing sides of the interposer 1000. In other embodiments, the first and second substrates 1002/ 1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the invention, apparatuses or processes disclosed herein, such as nanowire or nanoribbon channels that are formed from a multi-layer stack in an ART trench, may be used in the fabrication of interposer 1000 or more specifically, the devices 1014 or any other structure that includes a transistor within the interposer.

Figure 14:
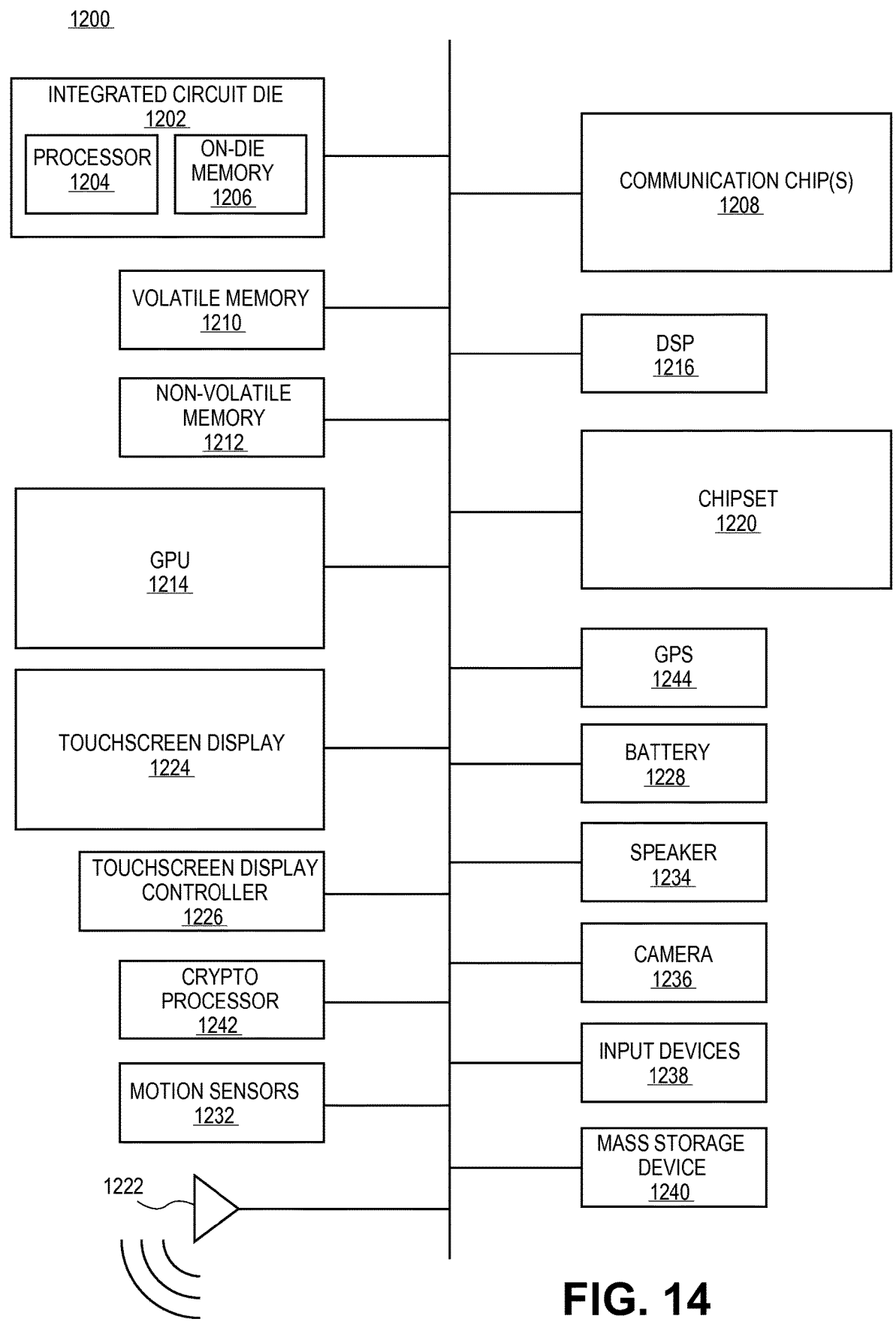
FIG. 14 is a schematic of a computing device built in accordance with an embodiment of the invention.

FIG. 14 illustrates a computing device 1200 in accordance with one embodiment of the invention. The computing device 1200 may include a number of components. In one embodiment, these components are attached to one or more motherboards. In an alternate embodiment, these components are fabricated onto a single system-on-a-chip (SoC) die rather than a motherboard. The components in the computing device 1200 include, but are not limited to, an integrated circuit die 1202 and at least one communication chip 1208. In some implementations the communication chip 1208 is fabricated as part of the integrated circuit die 1202. The integrated circuit die 1202 may include a CPU 1204 as well as on-die memory 1206, often used as cache memory, that can be provided by technologies such as embedded DRAM (eDRAM) or spin-transfer torque memory (STTM or STTM-RAM).

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit 1214 (GPU), a digital signal processor 1216, a crypto processor 1242 (a specialized processor that executes cryptographic algorithms within hardware), a chipset 1220, an antenna 1222, a display or a touchscreen display 1224, a touchscreen controller 1226, a battery 1228 or other power source, a power amplifier (not shown), a global positioning system (GPS) device 1228, a compass 1230, a motion coprocessor or sensors 1232 (that may include an accelerometer, a gyroscope, and a compass), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth).

The communications chip 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1208. For instance, a first communication chip 1208 may be dedicated to shorter range wireless communications such as Wi-Fi and Bluetooth and a second communication chip 1208 may be dedicated to longer range wireless communications such as GPS, EDGE, GPRS, CDMA, WiMAX, LTE, Ev-DO, and others.

The processor 1204 of the computing device 1200 includes one or more devices, such as gate-all-around transistors with nanowire or nanoribbon channels, that are formed in accordance with embodiments of the invention. The term "processor" may refer to any device or portion of a device that processes electronic data from registers and/or memory to transform that electronic data into other electronic data that may be stored in registers and/or memory.

The communication chip 1208 may also include one or more devices, such as gate-all-around transistors with nanowire or nanoribbon channels that are formed from a multi-layer stack in an ART trench.

In further embodiments, another component housed within the computing device 1200 may contain one or more devices, such as gate-all-around transistors with nanowire or nanoribbon channels that are formed from a multi-layer stack in an ART trench.

In various embodiments, the computing device 1200 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a method for forming a microelectronic device, comprising: forming a multi-layer stack within a trench formed in a shallow trench isolation (STI) layer, wherein the multi-layer stack comprises at least a channel layer, a release layer formed below the channel layer, and a buffer layer formed below the channel layer; recessing the STI layer so that a top surface of the STI layer is below a top surface of the release layer; and removing the release layer with an etching process that selectively removes the release layer relative to the channel layer. An additional embodiment may also include a method for forming a microelectronic device, wherein the STI layer is formed over a substrate layer, and wherein the multi-layer stack is epitaxially grown over the substrate layer. An additional embodiment may also include a method for forming a microelectronic device, wherein the buffer layer, the release layer and the channel layer are each a III-V semiconductor material and the substrate layer is a silicon layer. An additional embodiment may also include a method for forming a microelectronic device, wherein the buffer layer is GaAs or poly-GaAs, the release layer is InP, and the channel layer is InGaAs. An additional embodiment may also include a method for forming a microelectronic device, wherein the etching process that selectively removes the release layer relative to the channel layer is a wet-etching process that includes HCl and $H_2SO_4$. An additional embodiment may also include a method for forming a microelectronic device, wherein the trench has an aspect ratio that is 2:1 or greater prior to being recessed. An additional embodiment may also include a method for forming a microelectronic device, wherein the buffer layer accounts for at least a quarter of the thickness of the multi-layer stack. An additional embodiment may also include a method for forming a microelectronic device, wherein the release layer has a thickness to width ratio that is 3:2 or greater. An additional embodiment may also include a method for forming a microelectronic device, wherein the channel layer is a nanowire channel layer or a nanoribbon channel layer. An additional embodiment may also include a method for forming a microelectronic device, further comprising: forming a sacrificial gate electrode over a portion of the multi-layer stack and the STI layer subsequent to recessing the STI layer below the channel layer and below a top surface of the release layer; and forming sidewall spacers along sidewalls of the sacrificial gate electrode. An additional embodiment may also include a method for forming a microelectronic device, further comprising: removing portions of the multi-layer stack that are not covered by the sacrificial gate electrode; and forming a replacement source/drain (S/D) region where the removed portions of the multi-layer stack were formed. An additional embodiment may also include a method for forming a microelectronic device, further comprising: forming an interlayer dielectric (ILD) layer over the portions of the STI layer and the multi-layer stack that are not covered by the sacrificial gate electrode or the sidewall spacers. An additional embodiment may also include a method for forming a microelectronic device, further comprising: removing the sacrificial gate electrode prior to removing the release layer; forming a bottom gate isolation layer over an exposed surface of the buffer layer that is between the sidewall spacers; forming a gate dielectric layer over the exposed surfaces of the channel layer that are between the sidewall spacers; and forming a gate electrode around the portion of the channel layer that is between the sidewall spacers. An additional embodiment may also include a method for forming a microelectronic device, wherein the multi-layer stack further comprises a second release layer formed above a top surface of the channel layer, and a second channel layer formed above a top surface of the second release layer. An additional embodiment may also include a method for forming a microelectronic device, wherein the etching process that selectively removes the release layer relative to the channel layer also selectively removes the second release layer relative to the second channel layer.

An additional embodiment of the invention may include a semiconductor device comprising: a first nanowire channel having a first end and a second end opposite the first end, wherein the first end and the second end of the first nanowire are mechanically and electrically coupled to source/drain (S/D) regions, and wherein the nanowire channel is formed above a trench in an STI layer; a gate dielectric layer that is formed completely around the surface of the nanowire channel between the first end and the second end; and a gate electrode formed over the surface of the gate dielectric layer and completely around the surface of the nanowire channel between the first end and the second end. An additional embodiment may also include a semiconductor device, wherein the nanowire channel is a III-V semiconductor material. An additional embodiment may also include a semiconductor device, wherein the S/D regions are formed over a top surface of a buffer layer that is formed over a substrate. An additional embodiment may also include a semiconductor device, wherein the surface of the substrate that contacts the buffer layer is a non-planar surface. An additional embodiment may also include a semiconductor device, wherein the non-planar surface of the substrate is defined by the <111>crystallographic plane of the substrate. An additional embodiment may also include a semiconductor device, wherein the trench has a width that is substantially equal to the width of the nanowire channel. An additional embodiment may also include a semiconductor device, further comprising one more additional nanowire channels, each having a first end and a second end opposite the first end, wherein the first ends and the second ends of the additional nanowires are mechanically and electrically coupled to the source/drain (S/D) regions and are aligned above or below the first nanowire channel, and wherein a gate dielectric layer is formed completely around the surface of the one or more additional nanowire channels between the first ends and the second ends, and wherein the gate electrode is formed over the surface of the gate dielectric layer and completely around the surfaces of the one or more additional nanowire channels between the first ends and the second ends.

An additional embodiment of the invention may include a method for forming a microelectronic device, comprising: forming a multi-layer stack within a trench formed in a shallow trench isolation (STI) layer, wherein the multi-layer stack comprises at least a channel layer, a release layer formed below the channel layer, and a buffer layer formed below the channel layer, wherein the buffer layer is GaAs or poly-GaAs, the release layer is InP, and the channel layer is InGaAs, and wherein the release layer has a thickness to width ratio that is 3:2 or greater; recessing the STI layer so that a top surface of the STI layer is below a top surface of the release layer; forming a sacrificial gate electrode over a portion of the multi-layer stack and the STI layer; forming sidewall spacers along sidewalls of the sacrificial gate electrode; removing portions of the multi-layer stack that are not covered by the sacrificial gate electrode; forming a replacement source/drain (S/D) region where the removed portions of the multi-layer stack were formed; forming an interlayer dielectric (ILD) layer over the portions of the STI layer and the multi-layer stack that are not covered by the sacrificial gate electrode or the sidewall spacers; removing the sacrificial gate electrode; forming a bottom gate isolation layer over an exposed surface of the buffer layer that is between the sidewall spacers; removing the release layer with an etching process that selectively removes the release layer relative to the channel layer; forming a gate dielectric layer over the exposed surfaces of the channel layer that are between the sidewall spacers; and forming a gate electrode around the portion of the channel layer that is between the sidewall spacers. An additional embodiment may also include a method for forming a microelectronic device, wherein the channel layer is a nanowire channel layer or a nanoribbon channel layer. An additional embodiment may also include a method for forming a microelectronic device, wherein the trench has an aspect ratio that is 2:1 or greater prior to being recessed, and wherein the buffer layer accounts for at least a quarter of the thickness of the multi-layer stack.

What is claimed is:

1. A method for forming a microelectronic device, comprising:
    forming a multi-layer stack within a trench formed in a shallow trench isolation (STI) layer, wherein growth of the multi-layer stack is confined by the STI layer, wherein the multi-layer stack comprises at least a channel layer, a release layer formed below the channel layer, and a buffer layer formed below the channel layer, wherein the buffer layer is formed over a substrate layer, wherein the substrate layer has a notched surface, wherein the notched surface has an uppermost point in contact with a vertical sidewall of the STI layer;
    recessing the STI layer so that a top surface of the STI layer is below a top surface of the release layer;
    forming a sacrificial gate electrode over a portion of the multi-layer stack and the STI layer subsequent to recessing the STI layer below the channel layer and below a top surface of the release layer;
    forming sidewall spacers along sidewalls of the sacrificial gate electrode;
    removing portions of the multi-layer stack that are not covered by the sacrificial gate electrode; and
    forming replacement source/drain regions where the removed portions of the multi-layer stack were formed, the replacement source/drain regions in lateral contact with the sidewall spacers at a location over the multi-layer stack; and
    removing the release layer with an etching process that selectively removes the release layer relative to the channel layer.

2. The method of claim 1, wherein the STI layer is formed over the substrate layer, and wherein the multi-layer stack is epitaxially grown over the substrate layer.

3. The method of claim 2, wherein the buffer layer, the release layer and the channel layer are each a III-V semiconductor material and the substrate layer is a silicon layer.

4. The method of claim 3, wherein the buffer layer is GaAs, poly-GaAs, or InP, the release layer is InP, and the channel layer is InGaAs.

5. The method of claim 4, wherein the etching process that selectively removes the release layer relative to the channel layer is a wet-etching process that includes HCl and $H_2SO_4$.

6. The method of claim 1, wherein the trench has an aspect ratio that is 2:1 or greater prior to being recessed.

7. The method of claim 6, wherein the buffer layer accounts for at least a quarter of the thickness of the multi-layer stack.

8. The method of claim 1, wherein the release layer has a thickness to width ratio that is 3:2 or greater.

9. The method of claim 1, wherein the channel layer is a nanowire channel layer or a nanoribbon channel layer.

10. The method of claim 1, further comprising:
    forming an interlayer dielectric (ILD) layer over the portions of the STI layer and the multi-layer stack that are not covered by the sacrificial gate electrode or the sidewall spacers.

11. The method of claim 10, further comprising:
    removing the sacrificial gate electrode prior to removing the release layer;
    forming a bottom gate isolation layer over an exposed surface of the buffer layer that is between the sidewall spacers;
    forming a gate dielectric layer over the exposed surfaces of the channel layer that are between the sidewall spacers; and
    forming a gate electrode around the portion of the channel layer that is between the sidewall spacers.

12. The method of claim 1, wherein the multi-layer stack further comprises a second release layer formed above a top surface of the channel layer, and a second channel layer formed above a top surface of the second release layer.

13. The method of claim 12, wherein the etching process that selectively removes the release layer relative to the channel layer also selectively removes the second release layer relative to the second channel layer.

14. A method for forming a microelectronic device, comprising:
    forming a multi-layer stack within a trench formed in a shallow trench isolation (STI) layer, wherein growth of the multi-layer stack is confined by the STI layer, wherein the multi-layer stack comprises at least a channel layer, a release layer formed below the channel layer, and a buffer layer formed below the channel layer, wherein the buffer layer is GaAs or poly-GaAs, the release layer is InP, and the channel layer is InGaAs, and wherein the release layer has a thickness to width ratio that is 3:2 or greater, and wherein the buffer layer is formed over a substrate layer, wherein the substrate layer has a notched surface, wherein the notched surface has an uppermost point in contact with a vertical sidewall of the STI layer;

recessing the STI layer so that a top surface of the STI layer is below a top surface of the release layer;

forming a sacrificial gate electrode over a portion of the multi-layer stack and the STI layer;

forming sidewall spacers along sidewalls of the sacrificial gate electrode;

removing portions of the multi-layer stack that are not covered by the sacrificial gate electrode;

forming replacement source/drain regions where the removed portions of the multi-layer stack were formed, the replacement source/drain regions in lateral contact with the sidewall spacers at a location over the multi-layer stack;

forming an interlayer dielectric (ILD) layer over the portions of the STI layer and the multi-layer stack that are not covered by the sacrificial gate electrode or the sidewall spacers;

removing the sacrificial gate electrode;

forming a bottom gate isolation layer over an exposed surface of the buffer layer that is between the sidewall spacers;

removing the release layer with an etching process that selectively removes the release layer relative to the channel layer;

forming a gate dielectric layer over the exposed surfaces of the channel layer that are between the sidewall spacers; and forming a gate electrode around the portion of the channel layer that is between the sidewall spacers.

15. The method of claim 14, wherein the channel layer is a nanowire channel layer or a nanoribbon channel layer.

16. The method of claim 14, wherein the trench has an aspect ratio that is 2:1 or greater prior to being recessed, and wherein the buffer layer accounts for at least a quarter of the thickness of the multi-layer stack.

* * * * *